United States Patent
Kang et al.

(10) Patent No.: US 7,352,634 B2
(45) Date of Patent: Apr. 1, 2008

(54) NONVOLATILE LATCH CIRCUIT AND SYSTEM ON CHIP WITH THE SAME

(75) Inventors: Hee Bok Kang, Daejeongwangyeok-si (KR); Jin Hong Ahn, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/325,351

(22) Filed: Jan. 5, 2006

(65) Prior Publication Data
US 2007/0019460 A1    Jan. 25, 2007

(30) Foreign Application Priority Data
Jul. 21, 2005    (KR) ...................... 10-2005-0066272

(51) Int. Cl.
*G11C 7/00*    (2006.01)
(52) U.S. Cl. ............ 365/189.05; 365/145; 365/189.02; 365/191
(58) Field of Classification Search ................ 365/145, 365/189.05, 189.02, 191
See application file for complete search history.

(56) References Cited

U.S. PATENT DOCUMENTS

| | | | |
|---|---|---|---|
| 5,301,142 A | 4/1994 | Suzuki et al. | |
| 6,161,237 A | 12/2000 | Tang | ............................. 5/621 |
| 6,239,624 B1 | 5/2001 | Yang et al. | |
| 6,882,203 B2 | 4/2005 | Miyagi | |
| 6,922,362 B2 * | 7/2005 | La Malfa et al. | ....... 365/185.28 |
| 2003/0214337 A1 | 11/2003 | Miyagi | |

FOREIGN PATENT DOCUMENTS

| | | |
|---|---|---|
| JP | 03-135109 | 6/1991 |
| JP | 2004-096727 | 3/2004 |

* cited by examiner

*Primary Examiner*—Pho M. Luu
(74) *Attorney, Agent, or Firm*—Townsend and Townsend and Crew LLP

(57) ABSTRACT

A nonvolatile latch circuit and a system on a chip with the same feature detection of change of latch data in an active period to store new data in a latch without an additional data storage time. The nonvolatile latch circuit does not require an additional data storage period but detects change of latch data in the active period to store new data in a nonvolatile latch unit. When power is accidentally off, new data are constantly stored in the nonvolatile latch unit, thereby preventing data loss and improving an operating speed without a booting time for restoring data.

10 Claims, 10 Drawing Sheets

NONVOLATILE LATCH CIRCUIT AND SYSTEM ON CHIP WITH THE SAME

BACKGROUND OF THE INVENTION

1. Field of the Invention

The present invention generally relates to a nonvolatile latch circuit and a system on a chip, and more specifically, to a technology of sensing a change in latch data during an active period in order to store new data in a latch circuit without requiring an additional system booting process in a power-off mode.

2. Description of the Related Art

FIG. 1 is a graph illustrating a current consumption change of a semiconductor chip used by a nanoscale device.

Referring to FIG. 1, when a technology node for representing a design rule of the device is large, active current which is operation current of a system on a chip (hereinafter, referred to as "SOC") is shown to be much larger than standby current in a non-operation state.

However, as the device size becomes smaller, the active current is shown to increase slowly while the standby current increases rapidly. Consequently, leakage current which is non-switching current on a sub threshold voltage Vt increases more rapidly than the switching current of the active current. That is, the leakage current that penetrates a CMOS is shown to increase rapidly in a standby state where a power source is applied and a chip is not operated.

Therefore, the power consumption of the chip can be reduced by cutting off power supply of the chip in the standby mode. When the power source of the chip is cut off, a circuit for storing and recalling a previous circuit state is required so as to restore the previous circuit state.

FIG. 2 is a circuit diagram illustrating a nonvolatile latch circuit for restoring the previous state in a power-off mode of the chip.

The nonvolatile latch circuit comprises a plurality of inverters IV1-IV8, NMOS transistors N1, N2, and a capacitor unit 10.

An inverter IV1 inverts data D synchronously with respect to a clock CK. A latch R1 which comprises inverter IV2 and IV3 latches an output signal of the inverter IV1 synchronously with respect to a clock /CK. An inverter IV4 inverts an output signal of the latch R1 synchronously with respect to the clock /CK. A latch R2 which comprises inverters IV5 and IV6 latches an output signal of the inverter IV4 to output data Q.

The NMOS transistors N1 and N2 selectively connects the capacitor unit 10 to the latch R1 in response to a switching signal SS. The capacitor unit 10 comprises a plurality of nonvolatile ferroelectric capacitors FC1-FC4. The nonvolatile ferroelectric capacitors FC1 and FC2 are controlled by an output signal of a plate line /PL1 driven by an inverter IV7. The nonvolatile ferroelectric capacitors FC3 and FC4 are controlled by an output signal of a plate line /PL2 driven by an inverter IV8.

The nonvolatile latch circuit positioned in each circuit region of the SOC stores nonvolatile data in a turn-on state of a power supply switch in the power-off mode. That is, through the latches R1 and R2 before the power switch is turned off, data is stored in the capacitor unit 10 or the previous data before the power-on mode is restored.

FIG. 3 is a diagram illustrating a data storage/recall method of the nonvolatile latch circuit.

The nonvolatile latch circuit stores states of the latches R1 and R2 in the capacitor unit 10 during a storage period in entry of the power-off mode, and restores data stored in the latches R1 and R2 during a recall period in entry of the power-on mode.

However, the nonvolatile latch circuit stores the previous data only in the previously power-off mode. As a result, when an accidental power-off state is generated during the active period, latch data in the active state is destroyed so that it is impossible to restore data.

SUMMARY OF THE INVENTION

Various embodiments of the present invention are directed at providing a nonvolatile latch circuit which does not include an additional storage period but senses change of latch data in the active period to store new data in a latch circuit without requiring an additional system booting process in a power-off mode.

According to an embodiment of the present invention, a nonvolatile latch circuit includes a nonvolatile latch unit adapted and configured to amplify and store a voltage level of an input signal in a nonvolatile ferroelectric capacitor in response to storage control signals during an active period where a clock is activated, a latch transition detecting unit adapted and configured to detect transition of an output signal from the nonvolatile latch unit to output a latch transition detecting signal, and a latch control unit adapted and configured to store data in the nonvolatile latch unit and output the storage control signals for restoring the stored data in response to the latch transition detecting signal and a power-on reset signal.

According to an embodiment of the present invention, a system on a chip includes a plurality of nonvolatile latch circuits to hold a logic state of latch data. The nonvolatile latch circuit comprises a nonvolatile latch unit adapted and configured to amplify and store a voltage level of an input signal in the nonvolatile ferroelectric capacitor in response to storage control signals while the clock is activated, a latch transition detecting unit adapted and configured to detect transition of an output signal from the nonvolatile latch unit to output the latch transition detecting signal, and a latch control unit adapted and configured to store data in the nonvolatile latch unit in response to the latch transition detecting signal and the power-on reset signal and output the storage control signals for restoring the data.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like part.

Figure 1:
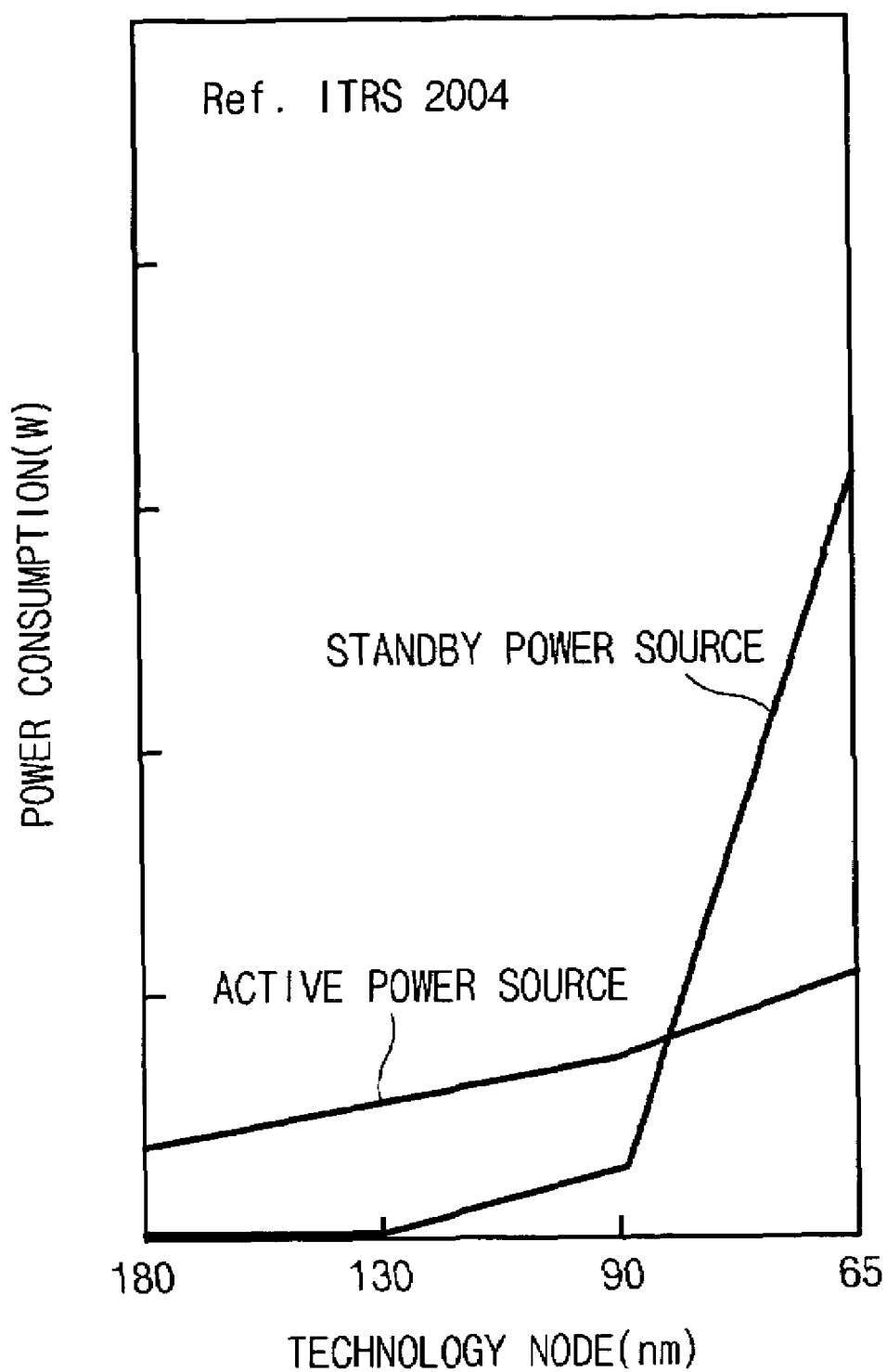
FIG. 1 is a graph illustrating a current consumption change of a semiconductor chip.
Figure 2:
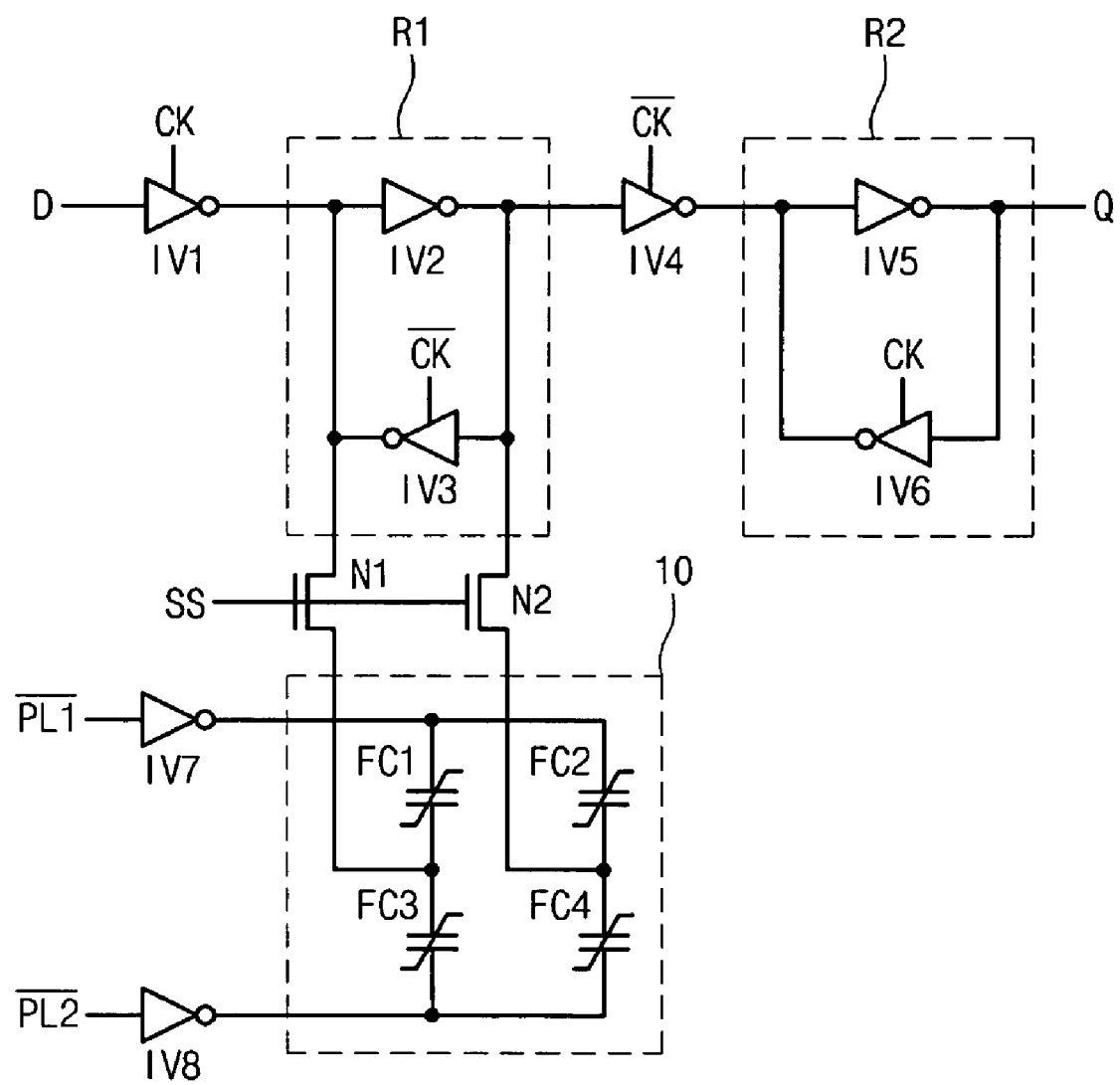
FIG. 2 is a circuit diagram illustrating a nonvolatile latch circuit.
Figure 3:
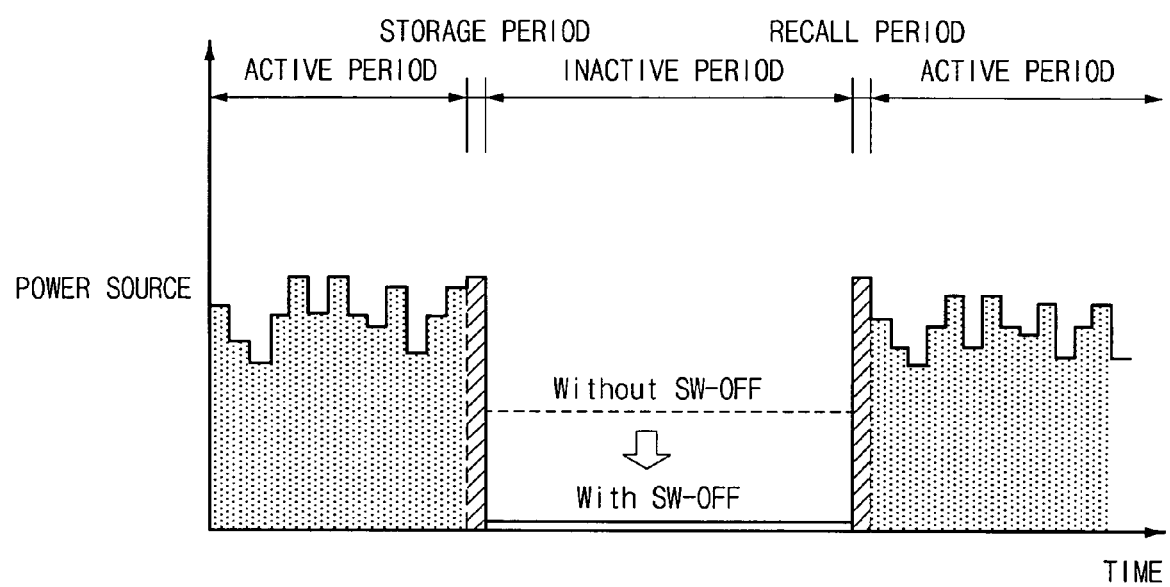
FIG. 3 is a diagram illustrating a data storage/recall method of the nonvolatile latch circuit.
Figure 4:
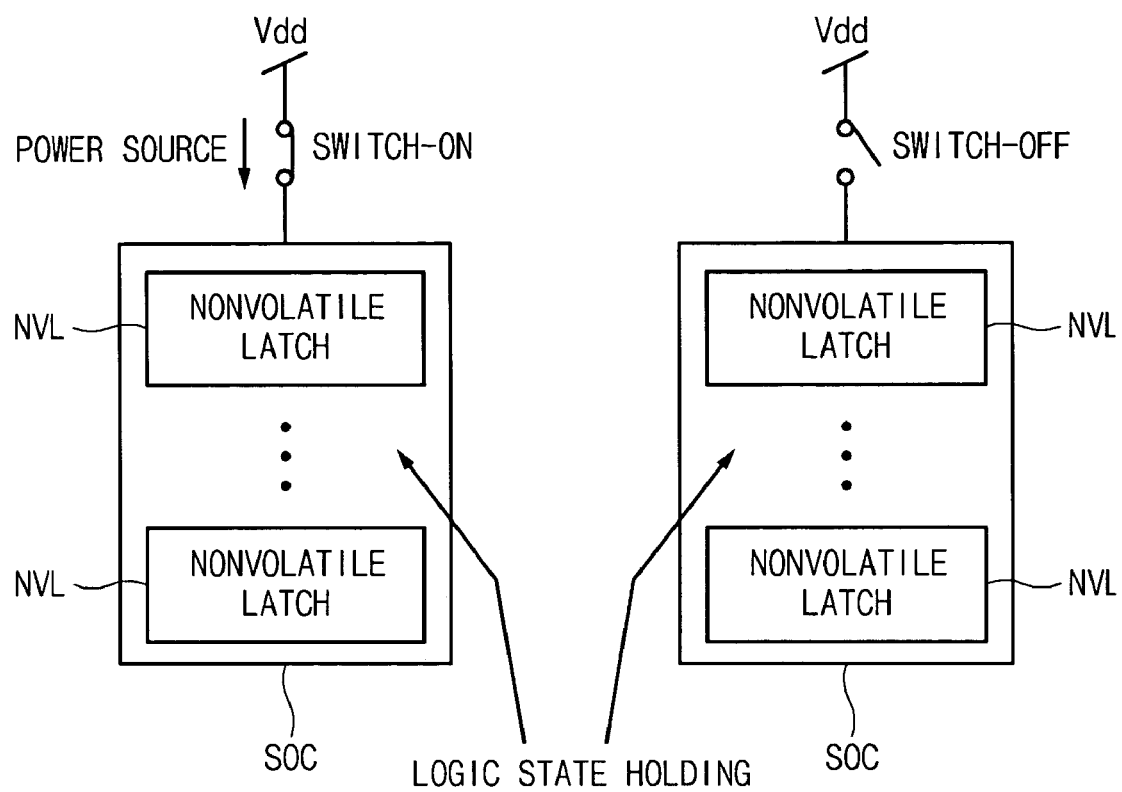
FIG. 4 is a diagram illustrating a system on a chip including a nonvolatile latch circuit according to an embodiment of the present invention.

FIG. 4 is a diagram illustrating a system on a chip including a nonvolatile latch circuit according to an embodiment of the present invention.

In this embodiment, a nonvolatile latch NVL positioned in each circuit region of a system on a chip (hereinafter, referred to as "SOC") stores a logic state of a turn-on state of a power supply switch in a power-off operation of the power supply switch.

Figure 5:
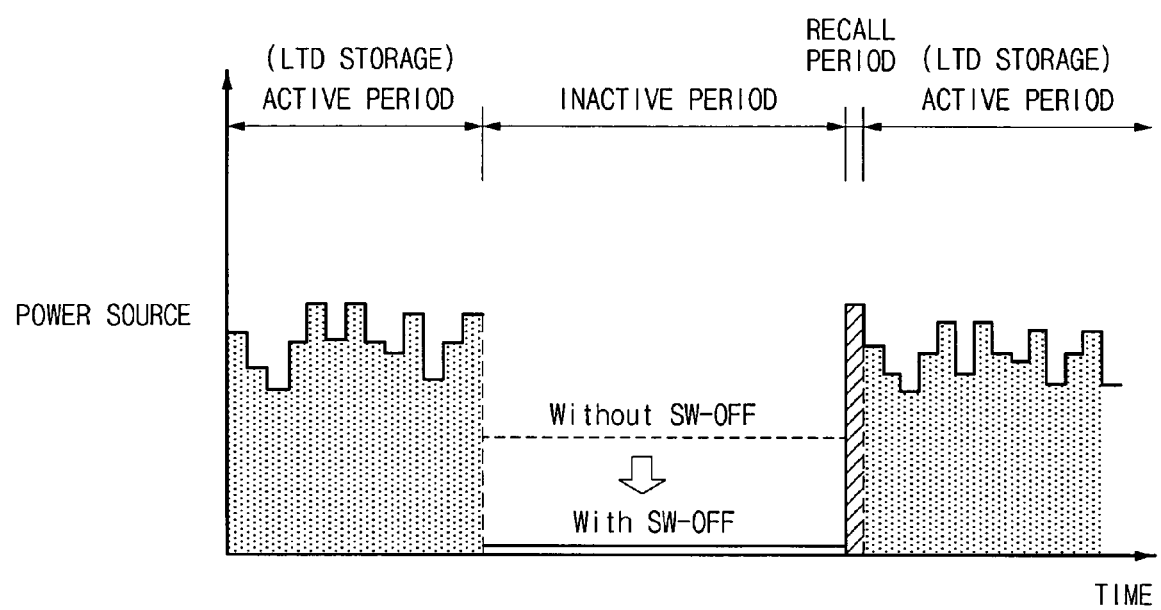
FIG. 5 is a diagram illustrating a data storage/recall method of the nonvolatile latch circuit according to an embodiment of the present invention.

FIG. 5 is a diagram illustrating a data storage/recall method of the nonvolatile latch circuit according to an embodiment of the present invention.

In this embodiment, an additional data storage period before entry of the power-off mode is not required. The change of latch data is detected in an active period, a latch transition detecting signal LTD is generated, and new data is stored in the nonvolatile latch NVL at any time. The data stored in the latch is restored during a recall period where the power is on.

As a result, the additional data storage period is not required because new data is constantly stored in the nonvolatile latch NVL even when power is accidentally off.

Figure 6:
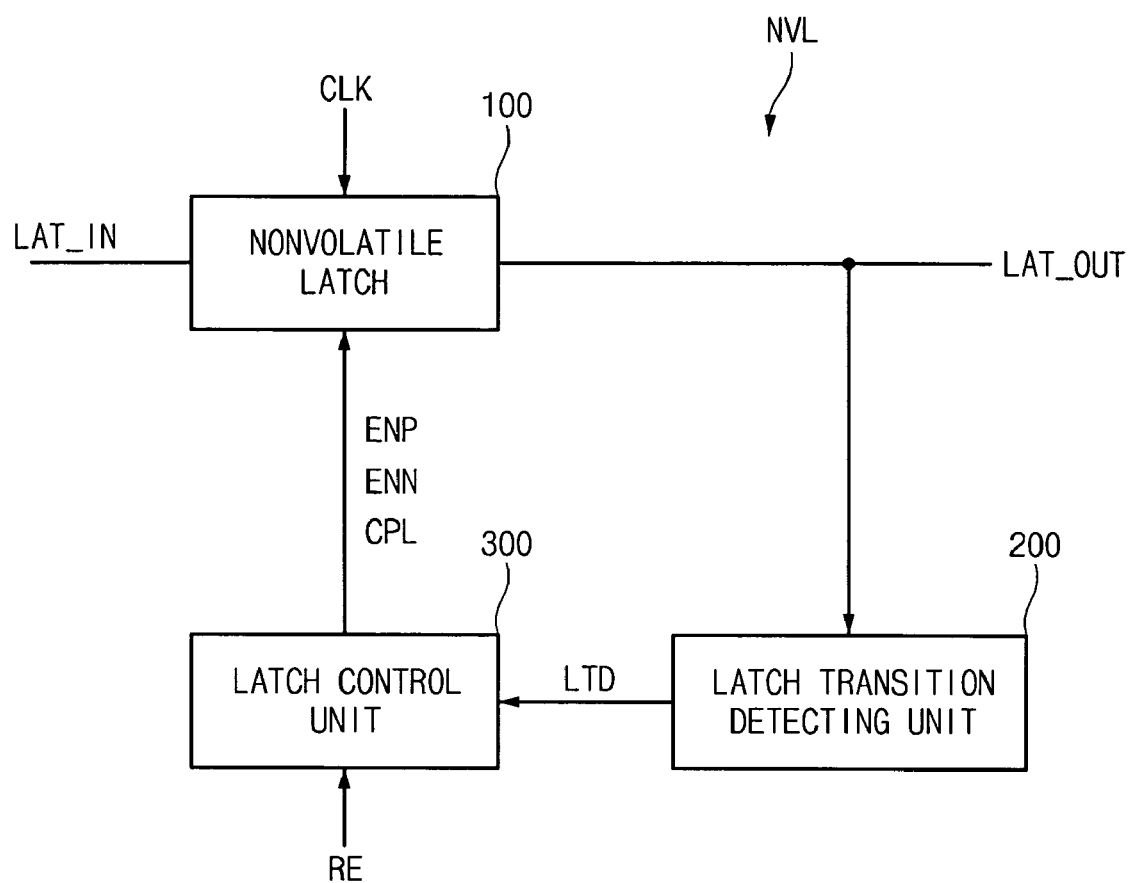
FIG. 6 is a diagram illustrating a nonvolatile latch circuit according to an embodiment of the present invention.

FIG. 6 is a diagram illustrating a nonvolatile latch circuit according to an embodiment of the present invention.

In this embodiment, the nonvolatile latch circuit includes a nonvolatile latch unit 100, a latch transition detecting unit 200 and a latch control unit 300.

The nonvolatile latch unit 100 latches an input signal LAT_IN in response to a clock CLK, a pull-up enable signal ENP, a pull-down enable signal ENN and a cell plate signal CPL to output an output signal LAT_OUT. The clock CLK is an activating signal for latching data inputted in the nonvolatile latch unit 100.

The latch transition detecting unit 200 latches transition of the output signal LAT_OUT to generate a latch transition detecting signal LTD which is a single pulse signal when latch data is transited.

The latch control unit 300 outputs a pull-up enable signal ENP, a pull-down enable signal ENN and a cell plate signal CPL for controlling data storage and recall operation of the nonvolatile latch unit 100 in response to a power-on reset signal RE and the latch transition detecting signal LTD.

Figure 7:
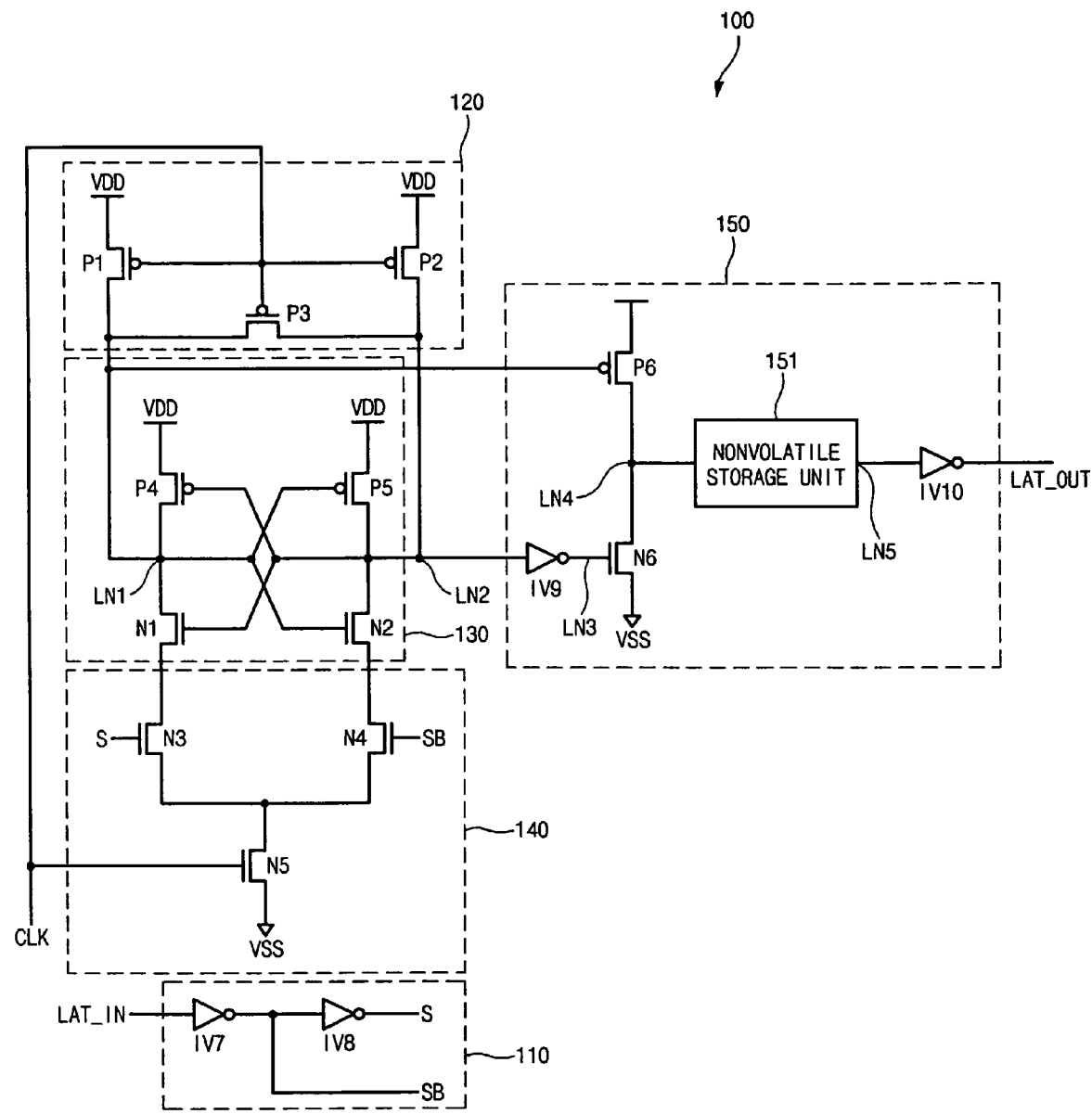
FIG. 7 is a circuit diagram illustrating a nonvolatile latch unit of FIG. 6.

FIG. 7 is a circuit diagram illustrating the nonvolatile latch unit 100 of FIG. 6.

The nonvolatile latch unit 100 includes an input driving unit 110, a precharge processing unit 120, an amplification unit 130, an input processing unit 140 and an output latch processing unit 150.

The input driving unit 110 includes inverters IV7 and IV8. The inverter IV7 inverts the input signal LAT_IN to output a control signal SB. The inverter IV8 inverts the control signal SB to output a control signal S.

The precharge processing unit 120 includes pull-up PMOS transistors P1 and P2, and a precharge PMOS transistor P3. The PMOS transistors P1 and P2, which are connected between a power voltage VDD terminal and nodes LN1, LN2, respectively, have a common gate to receive the clock CLK. The PMOS transistor P3, which is connected between the nodes LN1 and LN2, has a gate to receive the clock CLK.

The amplification unit 130, which includes cross-coupled PMOS transistors P4 and P5, and NMOS transistors N1 and N2, amplifies an output signal from the input processing unit 140. The PMOS transistors P4 and PS are connected between the power voltage VDD terminal and the nodes LN1, LN2, respectively. A gate of the PMOS transistor P4 is connected to the node LN2, and a gate of the PMOS transistor PS is connected to the node LN1.

The NMOS transistors N1 and N2 are connected between nodes LN1, LN2 and NMOS transistors N3 and N4. A gate of the NMOS transistor N1 is connected to the node LN2, and a gate of the NMOS transistor N2 is connected to the node LN1. The output nodes LN1 and LN2 are precharged to 'high' when the clock CLK becomes 'low' by the precharge processing unit 120.

The input processing unit 140 includes a plurality of NMOS transistors N3~N5. The NMOS transistors N3 and N4, which are connected between the NMOS transistors N1, N2 and the NMOS transistor N5, have a gate to receive control signals S and SB. The NMOS transistor N5, which is connected between the NMOS transistors N3 and N4 and a ground voltage terminal, has a gate to receive a predetermined frequency clock CLK continuously. The NMOS transistor N5 regulates an activation state of the amplification unit 130 and the input processing unit 140.

The output latch processing unit 150 includes inverters IV9, IV10, a PMOS transistor P6, a NMOS transistor N6 and a nonvolatile storage unit 151.

The PMOS transistor P6, which is connected between a power voltage terminal and a node LN4, has a gate connected to the node LN1. The PMOS transistor P6 regulates pull-up of the node LN4 depending on a voltage level of the node LN1. The NMOS transistor N6, which is connected between the node LN4 and the ground voltage terminal, has a gate to receive an output signal from the inverter IV9. The NMOS transistor N6 regulates pull-down of the node LN4 depending on a voltage level of the node LN3.

The nonvolatile storage unit 151 stores a pull-up/ pull-down voltage of the node LN4 at a nonvolatile latch state to output the voltage to the node LN5. The inverter IV10 inverts an output signal from the node LN5 to output the output signal LAT_OUT.

Figure 8:
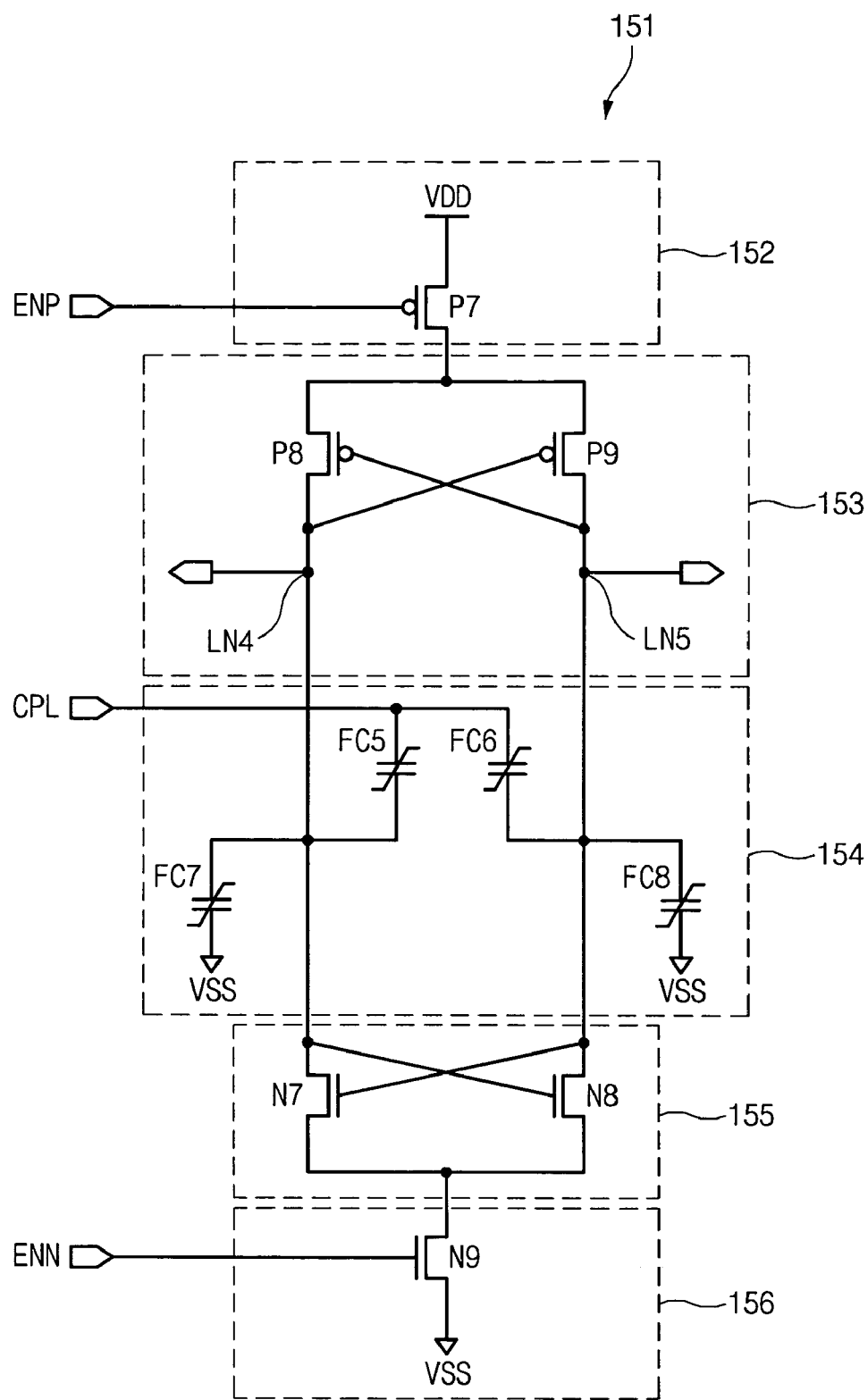
FIG. 8 is a circuit diagram illustrating a nonvolatile storage unit of FIG. 7.

FIG. 8 is a circuit diagram illustrating the nonvolatile storage unit 151 of FIG. 7.

The nonvolatile storage unit 151 includes a pull-up unit 152, a PMOS latch unit 153, a nonvolatile ferroelectric capacitor unit 154, a NMOS latch unit 155 and a pull-down unit 156.

The pull-up unit 152, which is connected between a power voltage VCC terminal and the PMOS latch unit 153, includes a PMOS transistor P7 having a gate to receive the pull-up enable signal ENP. The PMOS latch unit 153, which is connected between the PMOS transistor P7 and the nodes LN4, LN5, includes PMOS transistors P8 and P9 having a cross-coupled gate.

The nonvolatile ferroelectric capacitor 154 includes a plurality of nonvolatile ferroelectric capacitors FC5-FC8. The nonvolatile ferroelectric capacitors FC5 and FC6 are connected between a cell plate signal CPL terminal and the nodes LN4, LN5, respectively, and the nonvolatile ferroelectric capacitors FC7 and FC8 are connected between the nodes LN4, LN5 and the ground voltage terminal, respectively.

The NMOS latch unit 155 includes NMOS transistors N7 and N8 which are connected between the NMOS transistor N9 and the nodes LN4, LN5, respectively. The NMOS transistors N7 and N8 have cross-coupled gate. The pull-down unit 156 includes a NMOS transistor N9 which is connected between the NMOS latch unit 155 and the ground voltage terminal. The NMOS transistor N9 has a gate to receive the pull-down enable signal ENN.

Figure 9:
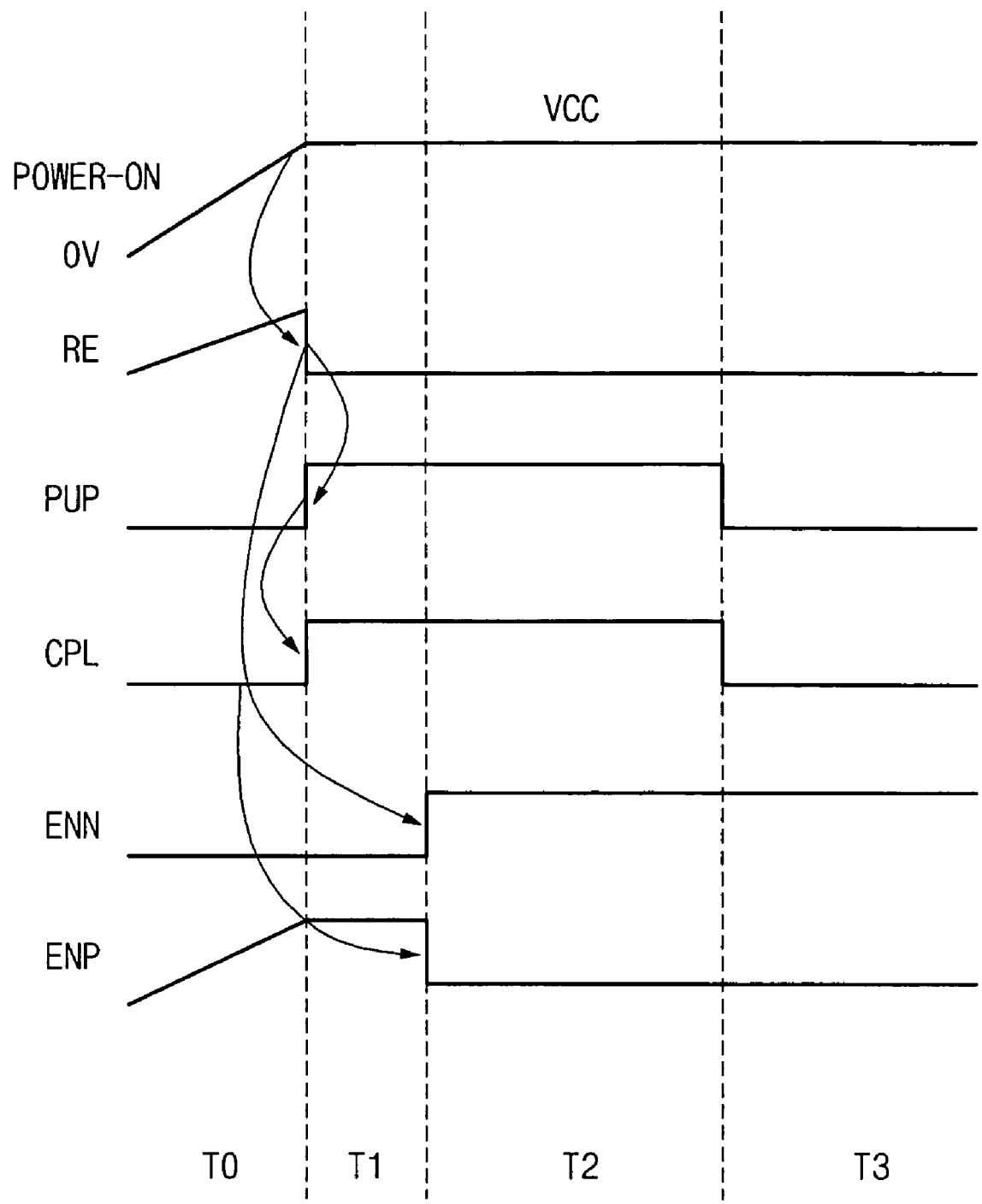
FIG. 9 is a timing diagram illustrating a power-on reset operation of the nonvolatile latch circuit according to an embodiment of the present invention.

FIG. 9 is a timing diagram illustrating a power-on reset operation of the nonvolatile latch circuit according to an embodiment of the present invention.

When an initial power-on power source reaches a stable power voltage VCC level, a power-on reset signal RE is activated to 'low'. When the power-on reset signal RE is activated, a power-up detecting signal PUP is activated to 'high'. As a result, the cell plate signal CPL transits to 'high'.

Charges stored in the nonvolatile ferroelectric capacitors FC5 and FC6 of the nonvolatile storage unit 151 generate a voltage difference in both nodes LN4 and LN5 by capacitance load of the nonvolatile ferroelectric capacitors FC7 and FC8.

When a sufficient voltage difference is generated in both terminals of the nodes LN4 and LN5, the pull-up enable signal ENP is activated to 'low' to turn on the PMOS transistor P7, and the pull-down enable signal ENN is activated to 'high' to turn on the NMOS transistor N9. As a result, data of the nodes LN4 and LN5 are amplified by the PMOS latch unit 153 and the NMOS latch unit 155.

When amplification of the data is completed, the cell plate signal CPL transits to 'low' again to restore destroyed high data of the nonvolatile ferroelectric capacitor FC5 or FC6.

Figure 10:
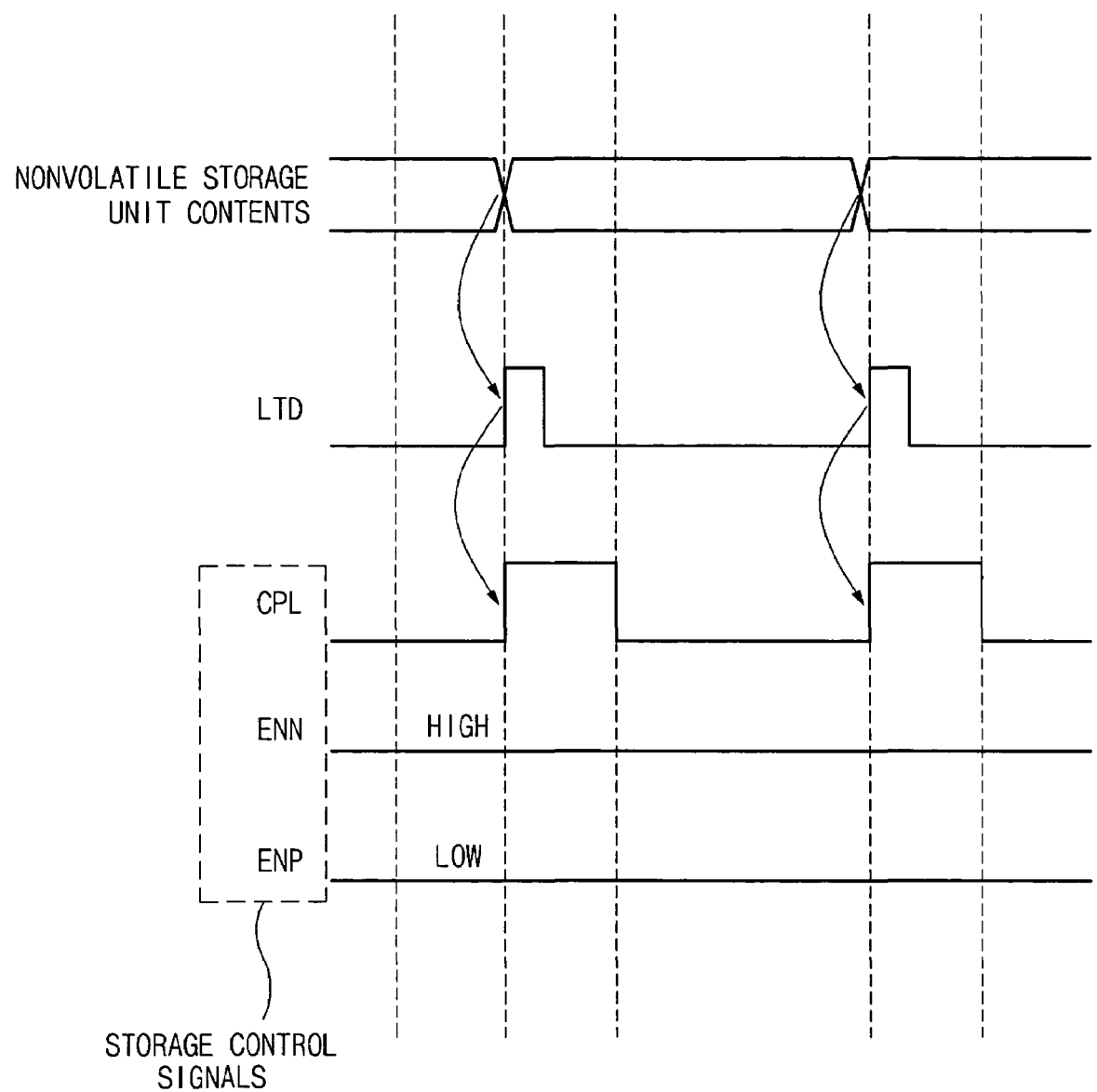
FIG. 10 is a timing diagram illustrating a data storage operation of the nonvolatile latch circuit according to an embodiment of the present invention.

FIG. 10 is a timing diagram illustrating a data storage operation of the nonvolatile latch circuit according to an embodiment of the present invention.

The latch transition detecting unit 200 detects change of contents in the output signal LAT_OUT of the nonvolatile latch unit 100 to generate the latch transition detecting signal LTD as a pulse type.

The latch control unit 300 outputs the cell plate signal CPL and the pull-down enable signal ENN as 'high' for controlling data storage and restoring operation in response to the latch transition detecting signal LTD.

The precharge processing unit 120 of the nonvolatile latch unit 100 equalizes the nodes LN1 and LN2 to a power voltage VDD level when the clock CLK is 'low'. When the clock CLK is 'high', the input processing unit 140 is operated to amplify voltages levels of the output nodes LN1 and LN2 depending on levels of the control signals S and SB.

Thereafter, depending on the voltage levels of the output nodes LN1 and LN2, the PMOS transistor P6 or the NMOS transistor N6 is selectively turned on so that a voltage level of the node LN4 is determined. The nonvolatile storage unit 151 stores the voltage level of the node LN4 in the nonvolatile ferroelectric capacitor unit 155 in response to the cell plate signal CPL, the pull-down enable signal ENN and the pull-up enable signal ENP.

In the above-described embodiment, new data are stored in the nonvolatile latch unit 100 when the change of the latch data is detected in the active period without requiring an additional data storage period. As a result, when power is accidentally off, new data are constantly stored in the nonvolatile latch unit 100 to prevent data loss and not to require a booting time for restoring data.

As described above, the change of the latch data is detected in the active period without requiring an additional data storage period to store new data in a latch circuit, so that an additional system booting process is not required in a power-off mode, thereby improving an operating speed.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A nonvolatile latch circuit comprising:
   a nonvolatile latch unit configured to amplify and store a voltage level of an input signal in a nonvolatile ferroelectric capacitor in response to storage control signals during an active period where a clock is activated;
   a latch transition detecting unit configured to detect transition of an output signal from the nonvolatile latch unit to output a latch transition detecting signal when the output signal from the nonvolatile latch unit is transitioned; and
   a latch control unit configured to store data in the nonvolatile latch unit and output the storage control signals for restoring the stored data in response to the latch transition detecting signal and a power-on reset signal.

2. The nonvolatile latch circuit according to claim 1, wherein the latch transition detecting unit generates the latch transition detecting signal as a pulse type when a change of contents is generated from the output signal.

3. The nonvolatile latch circuit according to claim 1, wherein the storage control signals includes a cell plate signal, a pull-up enable signal and a pull-down enable signal.

4. The nonvolatile latch circuit according to claim 1, wherein the nonvolatile latch unit comprises:
   an input driving unit configured to invert the input signal sequentially to output a first control signal and a second control signal respectively at a first and second output terminal, which have different phases;
   a precharge processing unit configured to equalize the first and second output terminals in response to the clock;
   an input processing unit configured to generate a voltage difference in the first and second output terminals in response to the first control signal and the second control signal;
   an amplification unit configured to amplify voltage levels of the first and second output terminals when the input processing unit is activated; and
   a nonvolatile storage unit configured to store a pull-up or a pull-down voltage level depending on the voltage levels of the first and second output terminals.

5. The nonvolatile latch circuit according to claim 4, wherein the input driving unit comprises:
   a first driver configured to drive the input signal to output the first control signal; and
   a second driver configured to drive an output signal from the first driver to output the second control signal.

6. The nonvolatile latch circuit according to claim 4, wherein the precharge processing unit comprises:

a pull-up unit configured to pull up the first and second output terminals to a power voltage level in response to the clock; and a precharge unit configured to equalize the first and second output terminals in response to the clock.

7. The nonvolatile latch circuit according to claim 4, wherein the amplification unit comprises:

a pull-up latch unit configured to be connected between a power voltage terminal and the first and second output terminals; and a pull-down latch unit configured to be connected between the first and second output terminals and the input processing unit.

8. The nonvolatile latch circuit according to claim 4, wherein the input processing unit comprises:

a first switch unit configured to selectively supply a ground voltage in response to the clock; and second and third switch units configured to selectively supply the ground voltage transmitted by the first switch unit to the amplification unit in response to the first control signal and the second control signal.

9. The nonvolatile latch circuit according to claim 4, wherein the output latch processing unit comprises:

a pull-up unit configured to pull up an input terminal in response to an amplification output signal of the amplification unit;

a pull-down unit configured to pull down the input terminal in response to the amplification output signal of the amplification unit;

a nonvolatile storage unit configured to store a pull up/pull down output signal from the pull-up unit or the pull-down unit; and an output driver configured to drive a storage output signal of the nonvolatile storage unit to output the driver output signal.

10. The nonvolatile latch circuit according to claim 9, wherein the nonvolatile storage unit comprises:

a pull-up unit configured to supply a power voltage in response to a pull-up enable signal;

a pull-up latch unit configured to latch the power voltage supplied by the pull-up unit;

a pull-down unit configured to supply a ground voltage in response to a pull-down enable signal;

a nonvolatile ferroelectric capacitor unit configured to generate a voltage difference in both storage nodes in response to a cell plate signal; and a pull-down latch unit configured to latch the ground voltage supplied by the pull-down unit.

* * * * *